United States Patent
Sato

(10) Patent No.: US 11,101,155 B2
(45) Date of Patent: Aug. 24, 2021

(54) BOARD STORING CONTAINER

(71) Applicant: MIRAIAL CO., LTD., Tokyo (JP)

(72) Inventor: Kyohei Sato, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 56 days.

(21) Appl. No.: 16/603,087

(22) PCT Filed: Apr. 5, 2017

(86) PCT No.: PCT/JP2017/014281
§ 371 (c)(1),
(2) Date: Oct. 4, 2019

(87) PCT Pub. No.: WO2018/185894
PCT Pub. Date: Oct. 11, 2018

(65) Prior Publication Data
US 2020/0051841 A1    Feb. 13, 2020

(51) Int. Cl.
*H01L 21/673* (2006.01)

(52) U.S. Cl.
CPC .. *H01L 21/67386* (2013.01); *H01L 21/67383* (2013.01)

(58) Field of Classification Search
CPC ......... H01L 21/67383; H01L 21/67386; H01L 21/6735; H01L 21/67369; H01L 21/673
USPC .......................................... 206/711, 710, 454
See application file for complete search history.

(56) References Cited

U.S. PATENT DOCUMENTS

| | | | | |
|---|---|---|---|---|
| 6,267,245 B1 * | 7/2001 | Bores | ............... | H01L 21/67383 206/711 |
| 7,344,031 B2 * | 3/2008 | Hasegawa | ......... | H01L 21/67369 206/710 |
| 7,455,181 B2 * | 11/2008 | Matsutori | ......... | H01L 21/67369 206/454 |
| 7,523,830 B2 * | 4/2009 | Burns | ............... | H01L 21/67369 206/454 |
| 2011/0000817 A1 | 1/2011 | Hosoi et al. | | |
| 2013/0299384 A1 | 11/2013 | Fuller | | |

FOREIGN PATENT DOCUMENTS

| | | |
|---|---|---|
| JP | 1990106831 U | 8/1998 |
| JP | 2009124063 A | 6/2009 |
| JP | 2013540372 A | 10/2013 |
| JP | 2015135881 A | 7/2015 |
| JP | 2016149492 A | 8/2016 |
| WO | WO2009131016 A1 | 10/2009 |
| WO | WO2012054627 A2 | 4/2012 |

* cited by examiner

*Primary Examiner* — Steven A. Reynolds
(74) *Attorney, Agent, or Firm* — Muncy, Geissler, Olds & Lowe, P.C.

(57) ABSTRACT

A lid body side substrate receiving portion includes a lower side substrate guiding inclined face and an upper side substrate guiding inclined face. In a direction in which a groove extends while a container main body opening portion is closed by a lid body, a length of the lower side substrate guiding inclined face in the upper-lower direction becomes longer as approaching a center of the container main body opening portion.

1 Claim, 8 Drawing Sheets

FIG. 7
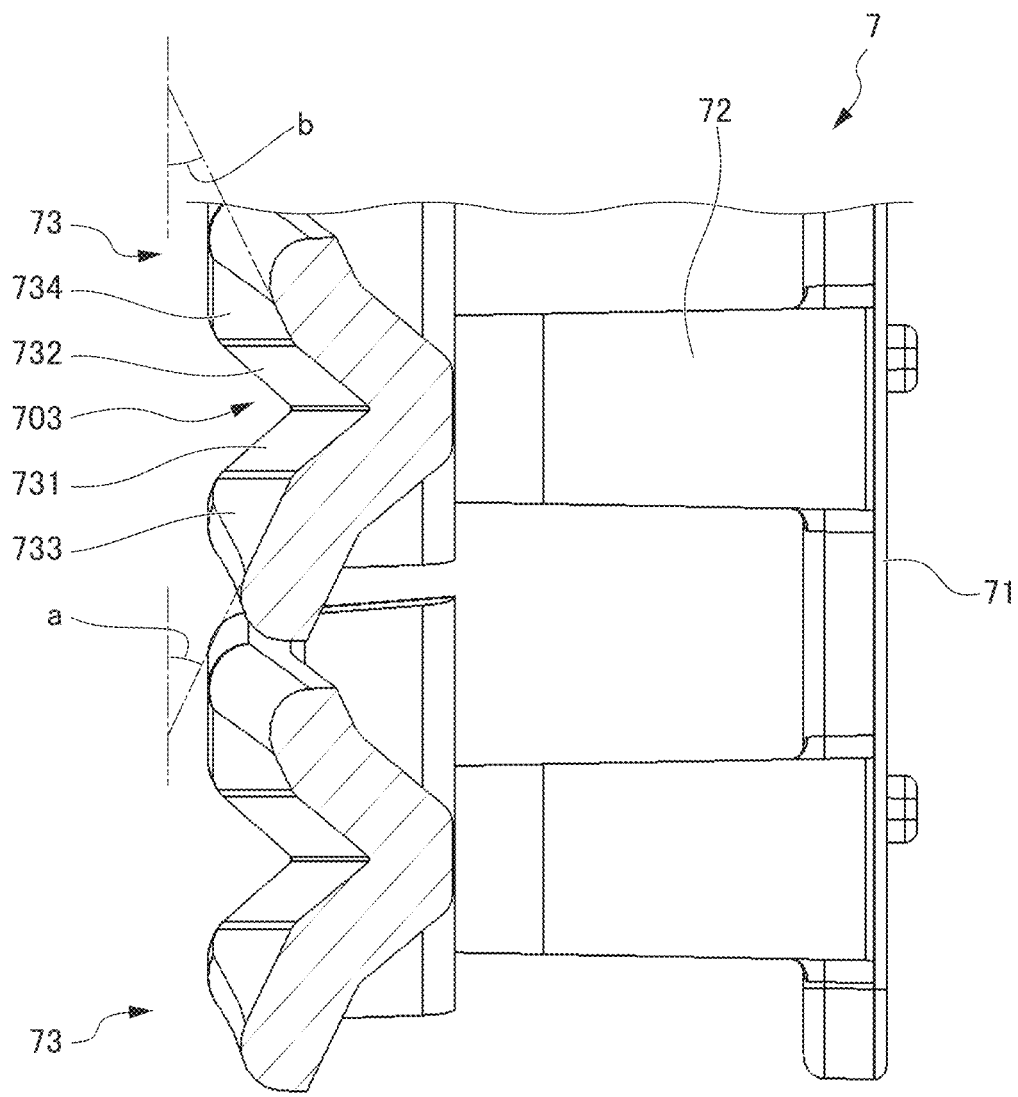
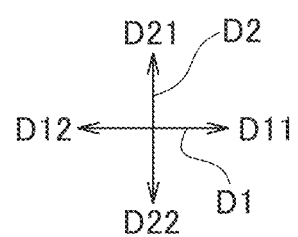

FIG. 8
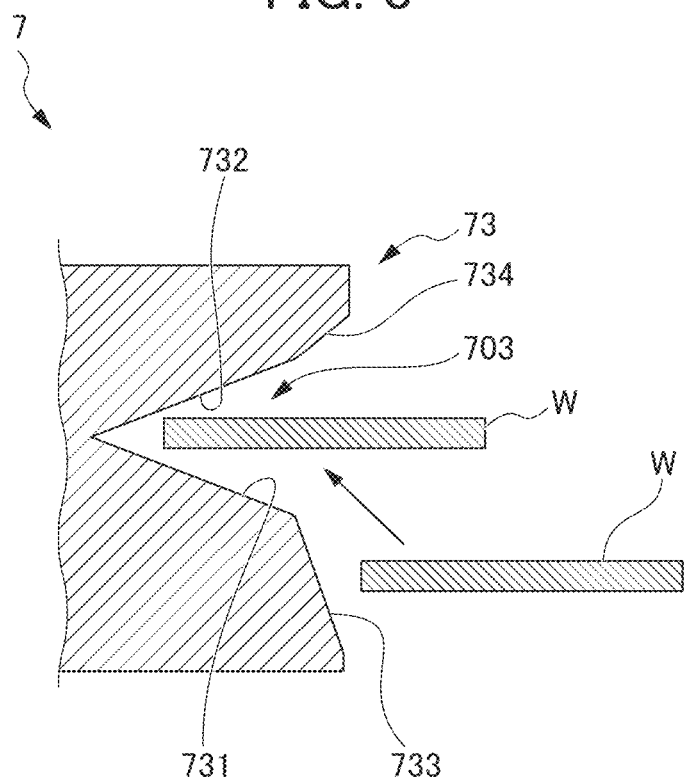
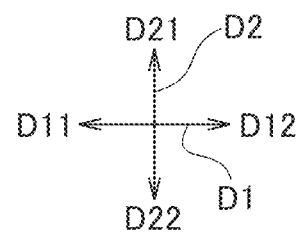

BOARD STORING CONTAINER

TECHNICAL FIELD

The present invention relates to a substrate storing container used, for example, when housing, storing, delivering, and transporting a substrate made from a semiconductor wafer, for example.

BACKGROUND ART

As a substrate storing container for storing and delivering a substrate made from a semiconductor wafer, a substrate storing container has been conventionally known that has a configuration including a container main body and a lid body (for example, refer to Patent Document 1, Patent Document 2, and Patent Document 3).

One end of the container main body has an opening circumferential portion at which a container main body opening portion is formed. The other end of the container main body has a closed tubular wall portion. A substrate storage space is formed in the container main body. The substrate storage space is formed by being surrounded by the wall portion, and can store a plurality of substrates. The lid body is attachable to and detachable from the opening circumferential portion, and can close the container main body opening portion. A side substrate support portion is provided at the wall portion so as to form a pair in the substrate storage space. While the container main body opening portion is not closed by the lid body, the side substrate support portion can support edge portions of the plurality of substrates in a state in which the adjacent substrates are spaced apart by a predetermined interval and arranged in parallel to each other.

A front retainer is provided at a portion of the lid body which faces the substrate storage space while the container main body opening portion is closed. The front retainer includes a lid body side substrate receiving portion that directly abuts the substrate to support the substrate and a lid body side leg portion that supports the lid body side substrate receiving portion. While the container main body opening portion is closed by the lid body, the front retainer can support the edges of the plurality of substrates. Furthermore, a back side substrate support portion is provided at the wall portion so as to form a pair with the front retainer. The back side substrate support portion can support the edges of the plurality of substrates. While the container main body opening portion is closed by the lid body, the back side substrate support portion cooperates with the front retainer to support the plurality of substrates, thereby supporting the plurality of substrates in a state in which the adjacent substrates are spaced apart by a predetermined interval and are arranged in parallel with each other.

Patent Document 1: Japanese Unexamined Patent Application, Publication No. 2015-135881
Patent Document 2: Japanese Unexamined Patent Application (Translation of PCT Application), Publication No. 2013-540372
Patent Document 3: Japanese Unexamined Utility Model Application, Publication No. H02-106831

DISCLOSURE OF THE INVENTION

Problems to be Solved by the Invention

In the substrate storing containers disclosed in the publications above, when a container main body opening portion is closed by the lid body, failure in guiding of a substrate in a front retainer, i.e., a state of substrate dislocation in which a substrate slips between a plurality of adjacent lid body side substrate receiving portions is likely to occur.

The present invention has an object of providing a substrate storing container that can suppress the occurrence of failure in guiding of a substrate in a front retainer.

Means for Solving the Problems

The present invention relates to a substrate storing container including: a container main body including an opening circumferential portion at one end thereof where a container main body opening portion is formed, and including a tubular wall portion having another end thereof which is closed, in which a substrate storage space is formed which can store a plurality of substrates by an inner face of the wall portion, and is in communication with the container main body opening portion; a lid body that is attachable to and detachable from the container main body opening portion and can close the container main body opening portion; a side substrate support portion that is provided to form a pair in the substrate storage space and, while the container main body opening portion is not closed by the lid body, can support edge portions of the plurality of substrates in a state in which adjacent substrates among the plurality of substrates are spaced apart by a predetermined interval and arranged in parallel to each other; a lid body side substrate support portion that, while the container main body opening portion is closed by the lid body, is disposed at a portion of the lid body that faces the substrate storage space and can support the edge portions of the plurality of substrates; and a back side substrate support portion that is provided to form a pair with the lid body side substrate support portion in the substrate storage space and can support the edge portions of the plurality of substrates and, while the container main body opening portion is closed by the lid body, cooperates with the lid body side substrate support portion to be able to support the plurality of substrates, in which the lid body side substrate support portion includes a lid body side substrate receiving portion that directly abuts the substrates to support the substrates, and a lid body side leg portion that supports the lid body side substrate receiving portion, in which the lid body side substrate receiving portion includes: a lower side inclined face that extends in an inclined manner to be spaced apart from a center of the substrate storage space; an upper side inclined face that extends in an inclined manner from an upper end portion of the lower side inclined face so as to approach the center of the substrate storage space; a lower side substrate guiding inclined face that is connected to a lower end portion of the lower side inclined face, in which an angle formed by the lower side substrate guiding inclined face with an upper-lower direction corresponding to a parallel direction in which the plurality of substrates are provided in parallel with each other is smaller than an angle formed by the lower side inclined face with the upper-lower direction; and an upper side substrate guiding inclined face that is connected to an upper end portion of the upper side inclined face, in which an angle formed by the upper side substrate guiding inclined face with the upper-lower direction is smaller than an angle formed by the upper side inclined face with the upper-lower direction, in which, while the container main body opening portion is closed by the lid body, the lower side inclined face and the upper side inclined face abut the substrate, and the substrate is supported in a groove that is formed by the lower side inclined face and the upper side inclined face, and in which, in a direction in which the groove extends while the container main body opening portion is closed by the lid body, a length of the lower side substrate guiding inclined face in the upper-lower direction becomes longer as approaching a center of the container main body opening portion.

Furthermore, it is preferable that the lid body side substrate receiving portion has a parallelogram shape as viewed in a direction from one end to the other end of the container main body.

Effects of the Invention

According to the present invention, it is possible to provide a substrate storing container that can suppress the occurrence of failure in guiding of a substrate in a front retainer.

BRIEF DESCRIPTION OF THE DRAWINGS

FIG. 7 is an enlarged cross-sectional view of a front retainer substrate receiving portion 73 of the substrate storing container 1 according to the embodiment of the present invention; and FIG. 8 is a schematic diagram illustrating a state in which the substrate W is inserted into a V-shaped groove 703 of the front retainer substrate receiving portion 73 of the substrate storing container 1 according to the embodiment of the present invention.

PREFERRED MODE FOR CARRYING OUT THE INVENTION

Figure 1:
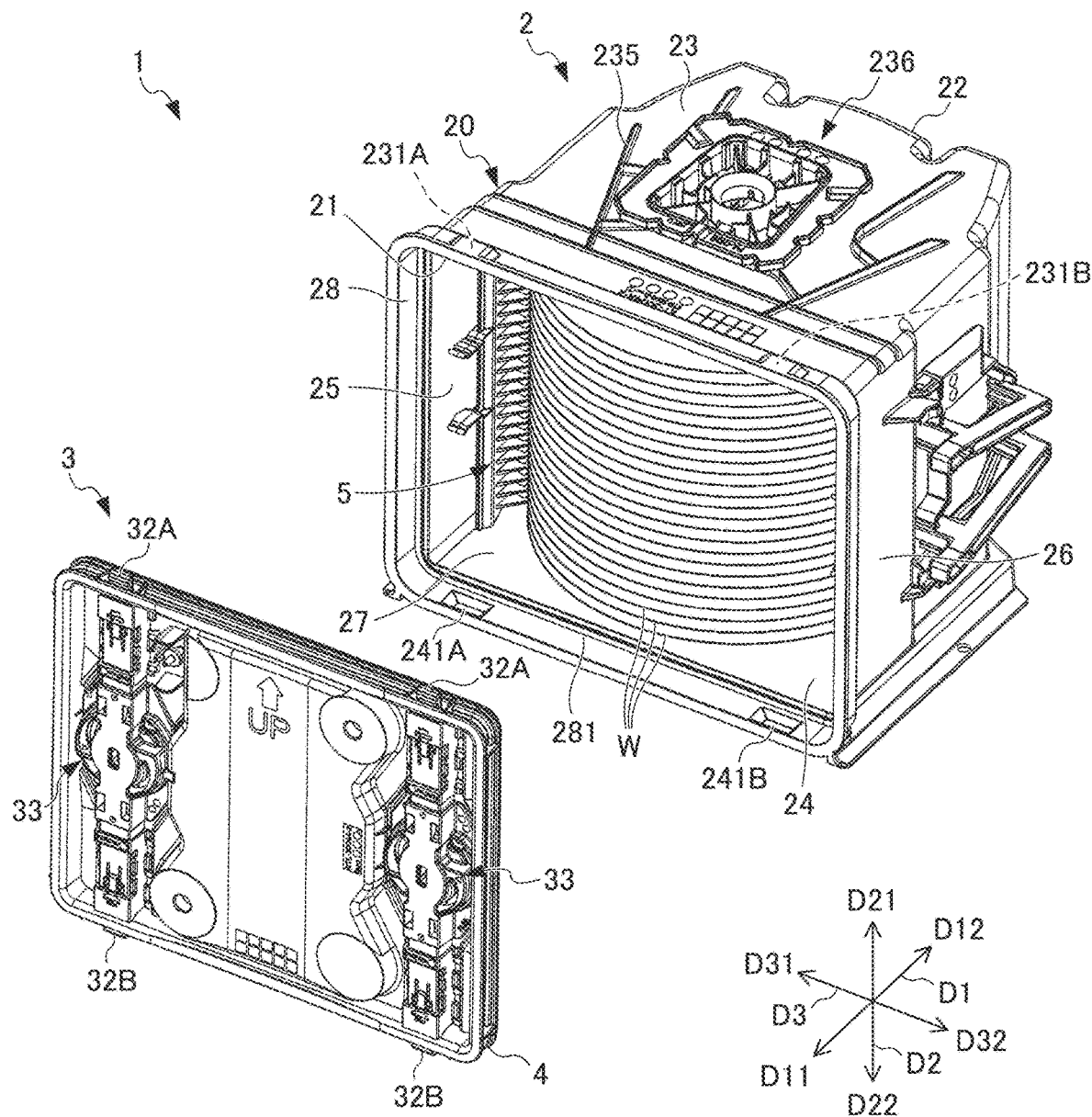
FIG. 1 is an exploded perspective view of a state in which a plurality of substrates W is stored in a substrate storing container 1 according to an embodiment of the present invention.
Figure 2:
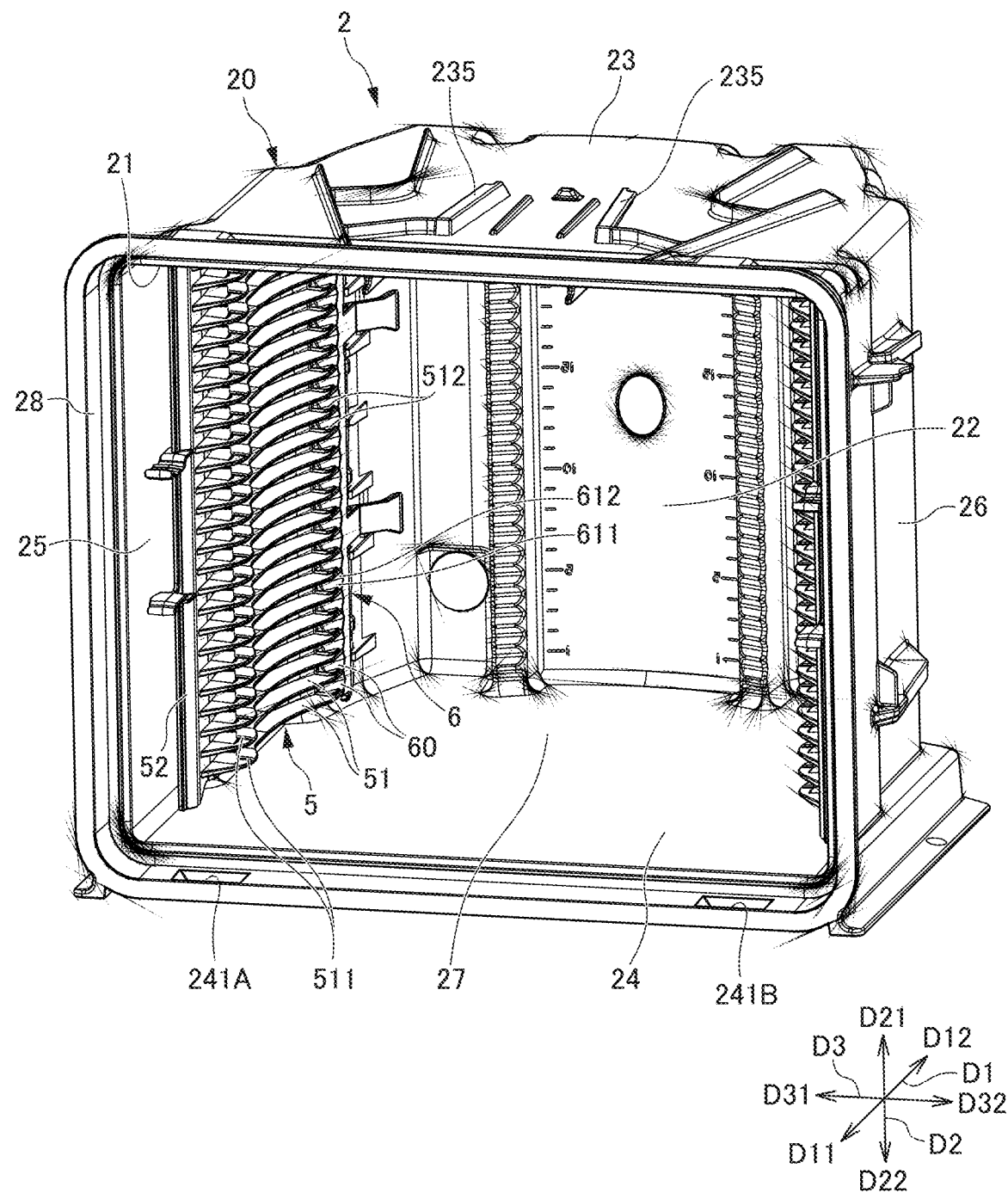
FIG. 2 is a perspective view of a container main body 2 of the substrate storing container 1 according to the embodiment of the present invention.
Figure 3:
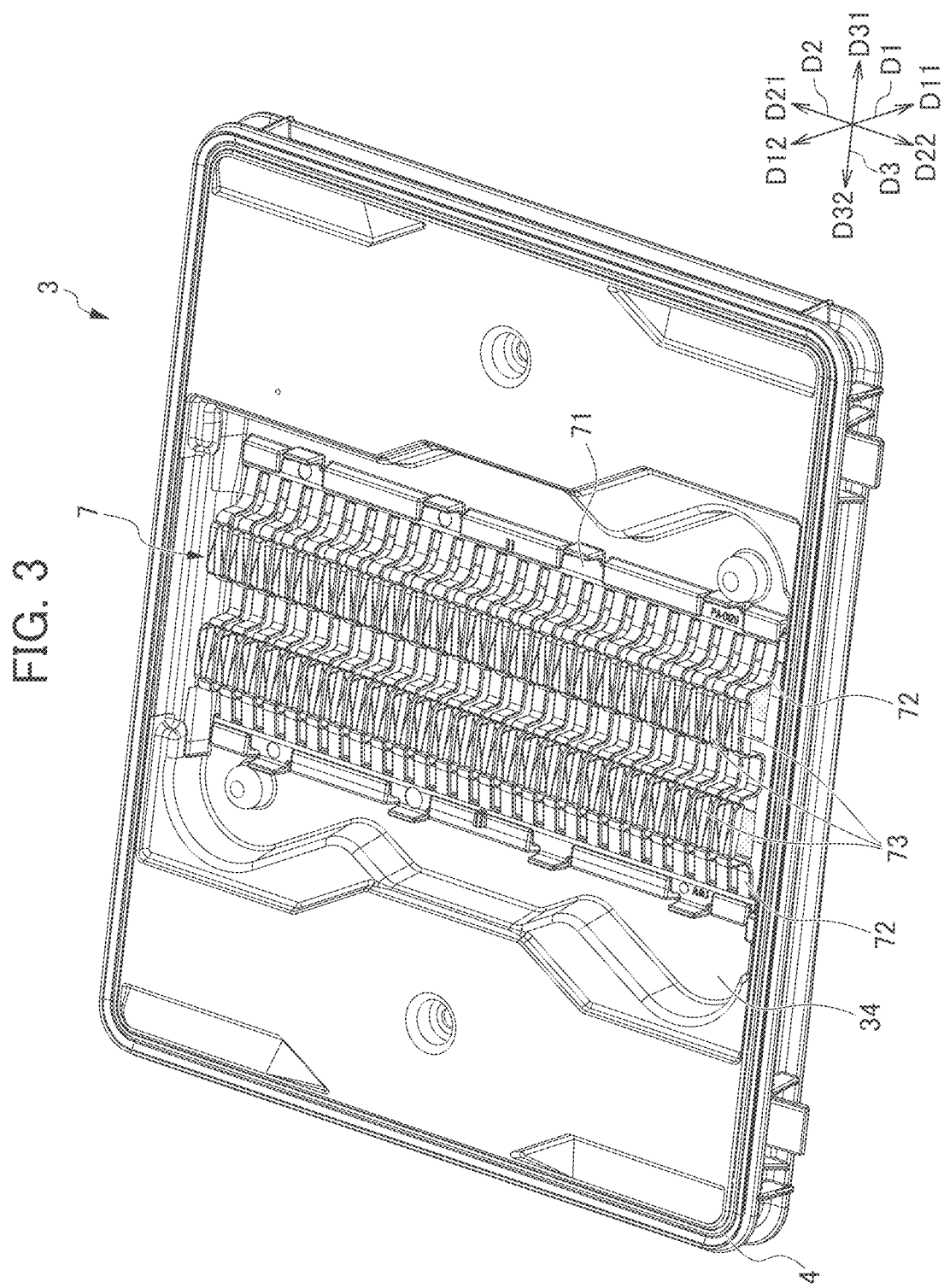
FIG. 3 is a perspective view of a lid body 3 of the substrate storing container 1 according to the embodiment of the present invention.

In the following, a substrate storing container 1 according to an embodiment will be described with reference to the drawings. FIG. 1 is an exploded perspective view of a state in which a plurality of substrates W is stored in the substrate storing container 1 according to the embodiment of the present invention. FIG. 2 is a perspective view of a container main body 2 of the substrate storing container 1 according to the embodiment of the present application. FIG. 3 is a perspective view of a lid body 3 of the substrate storing container 1 according to the embodiment of the present invention.

Herein, for the convenience of explanation, the direction from the container main body 2 toward the lid body 3 (the direction from upper right to lower left in FIG. 1) is defined as a forward direction D11, and the opposite direction to the direction D11 is defined as a backward direction D12. Furthermore, these directions are defined as a forward-backward direction D1. Furthermore, the direction from a lower wall 24 to an upper wall 23 described later (upper direction in FIG. 1) is defined as an upper direction D21, and the direction opposite to the direction D21 is defined as a lower direction D22. In addition, these directions are defined as an upper-lower direction D2. Furthermore, the direction from a second side wall 26 toward a first side wall 25 (described later) (the direction from lower right to upper left in FIG. 1) is defined as a left direction D31, and the direction opposite to the direction D31 is defined as a right direction D32. Furthermore, these directions are defined as a left-right direction D3. Arrows indicating these directions are illustrated in the main drawings.

Furthermore, the substrates W (refer to FIG. 1) stored in the substrate storing container 1 are each a disk-like silicon wafer, glass wafer, sapphire wafer, etc., and are each a thin member used in industry. The substrates W according to the present embodiment are each a silicon wafer having a diameter of 300 mm.

As illustrated in FIG. 1, the substrate storing container 1 is used as a shipping container that stores the substrates W each made of a silicon wafer as described above, and transports the substrates W by transportation such as land transportation, air transportation, and marine transportation. The substrate storing container 1 includes a container main body 2 and a lid body 3. The container main body 2 includes a substrate support plate-like portion 5 as a side substrate support portion and a back side substrate support portion 6 (refer to FIG. 2, etc.). The lid body 3 includes a front retainer 7 as a lid body side substrate support portion (refer to FIG. 3, etc.).

The container main body 2 has a tubular wall portion 20 with a container main body opening portion 21 formed at one end and the other end closed. A substrate storage space 27 is formed in the container main body 2. The substrate storage space 27 is formed to be surrounded by the wall portion 20. The substrate support plate-like portion 5 is arranged at a part that is a part of the wall portion 20 forming the substrate storage space 27. As illustrated in FIG. 1, a plurality of substrates W can be stored in the substrate storage space 27.

The substrate support plate-like portion 5 is provided at the wall portion 20 so as to form a pair in the substrate storage space 27. While the container main body opening portion 21 is not closed by the lid body 3, the substrate support plate-like portion 5 abuts an edge portion of each of the plurality of substrates W, thereby making it possible to support the plurality of substrates W in a state in which adjacent substrates W are spaced apart by a predetermined interval and arranged in parallel to each other. The back side substrate support portion 6 is integrally molded with the substrate support plate-like portion 5 at the back side of the substrate support plate-like portion 5.

The back side substrate support portion 6 (refer to FIG. 2, etc.) is provided at the wall portion 20 so as to form a pair with a front retainer 7 (refer to FIG. 3, etc.) within the substrate storage space 27. When the container main body opening portion 21 is closed by the lid body 3, the back side substrate support portion 6 abuts the edge portion of each of the plurality of substrates W, thereby making it possible to support rear portions of the edge portions of the plurality of substrates W.

The lid body 3 is attachable to and detachable from an opening circumferential portion 28 (FIG. 1, etc.) that forms the container main body opening portion 21. The lid body 3 is able to open and close the container main body opening portion 21. The front retainer 7 is a part of the lid body 3 and provided at a part facing a portion which faces the substrate storage space 27 when the container main body opening portion 21 is closed by the lid body 3. The front retainer 7 is arranged so as to form a pair with the back side substrate support portion 6 in the interior of the substrate storage space 27.

When the container main body opening portion 21 is closed by the lid body 3, the front retainer 7 abuts the edge portion of each of the plurality of substrates W, thereby making it possible to support front portions of the edge portions of the plurality of substrates W. When the container main body opening portion 21 is closed by the lid body 3, the front retainer 7 supports the plurality of substrates W in cooperation with the back side substrate support portion 6, thereby retaining the plurality of substrates W in a state in which adjacent substrates W are spaced apart by a predetermined interval and arranged in parallel to each other.

The substrate storing container 1 is configured by a resin such as a plastic material and, unless explanations are particularly provided, examples of the resin of the plastic material include thermoplastic resins such as polycarbonate, cycloolefin polymer, polyether imide, polyether ketone, polybutylene terephthalate, polyether ether ketone, and liquid crystal polymers, alloys thereof, and the like. In a case of imparting conductivity to the resin of these molding materials, conductive materials such as carbon fiber, carbon powder, carbon nanotubes, and conductive polymers are selectively added. Furthermore, it is possible to add glass fiber, carbon fiber, and the like to enhance the rigidity.

Figure 4:
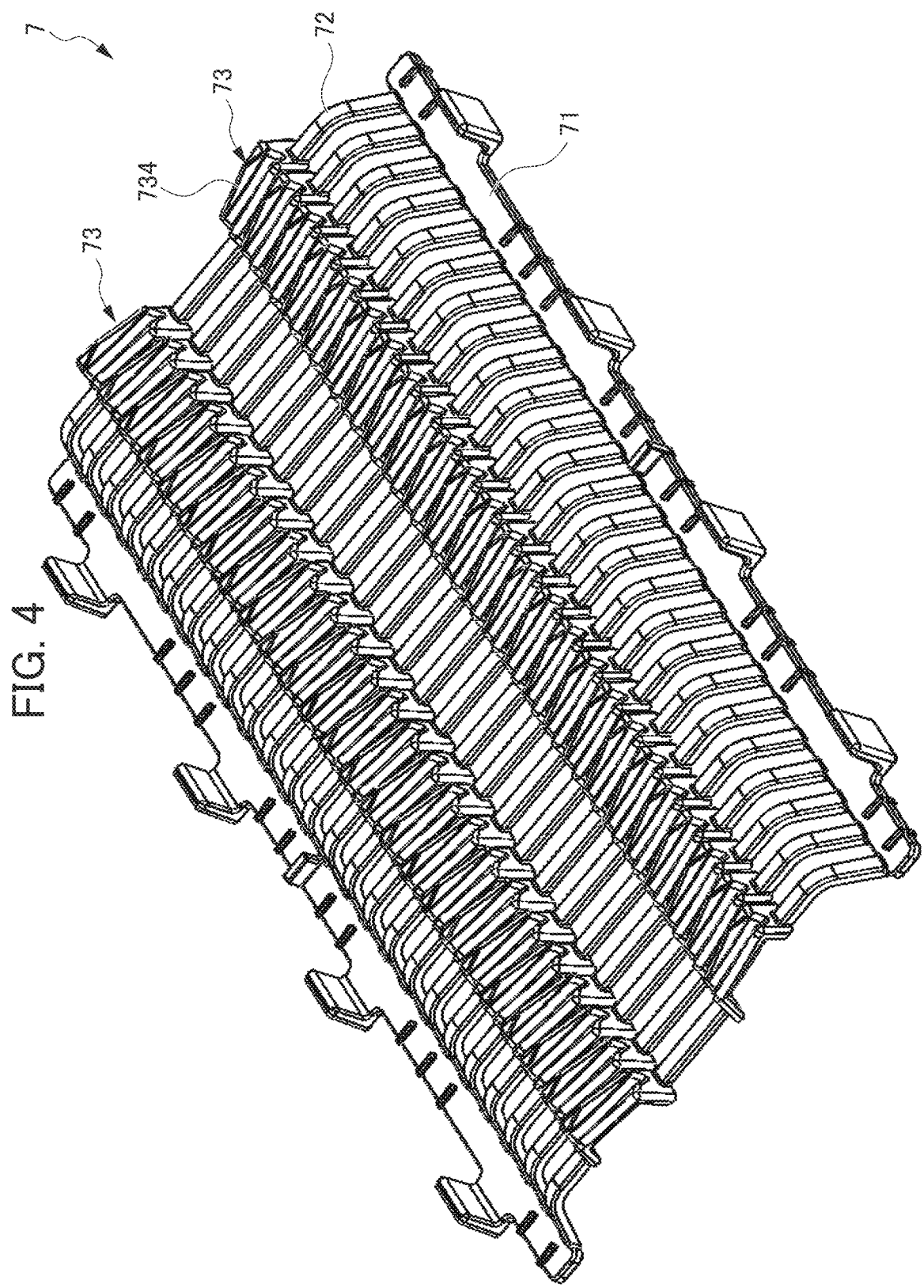
FIG. 4 is a perspective view of a front retainer 7 of the substrate storing container 1 according to the embodiment of the present invention.
Figure 5:
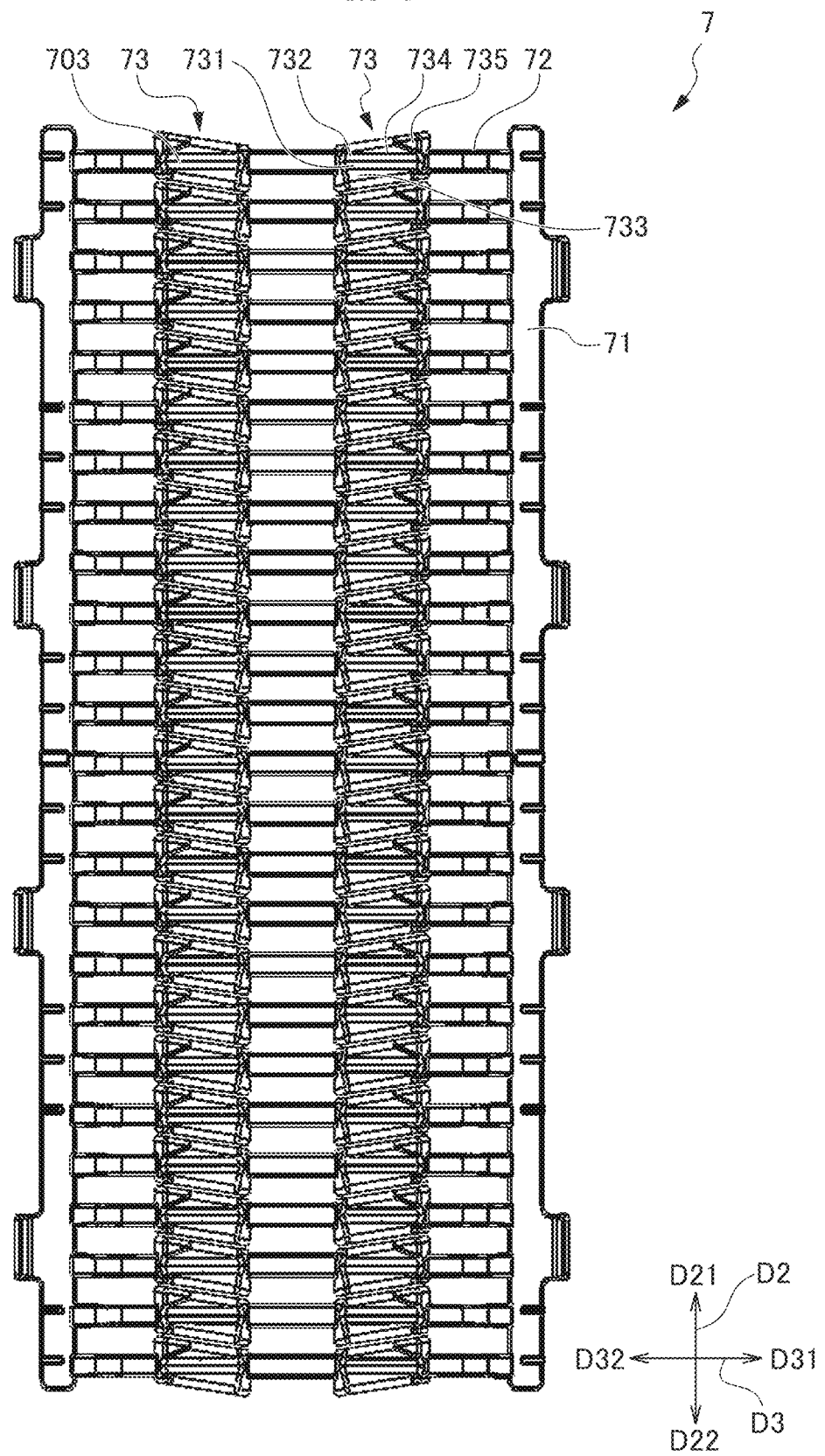
FIG. 5 is a front view of the front retainer 7 of the substrate storing container 1 according to the embodiment of the present invention.
Figure 6:
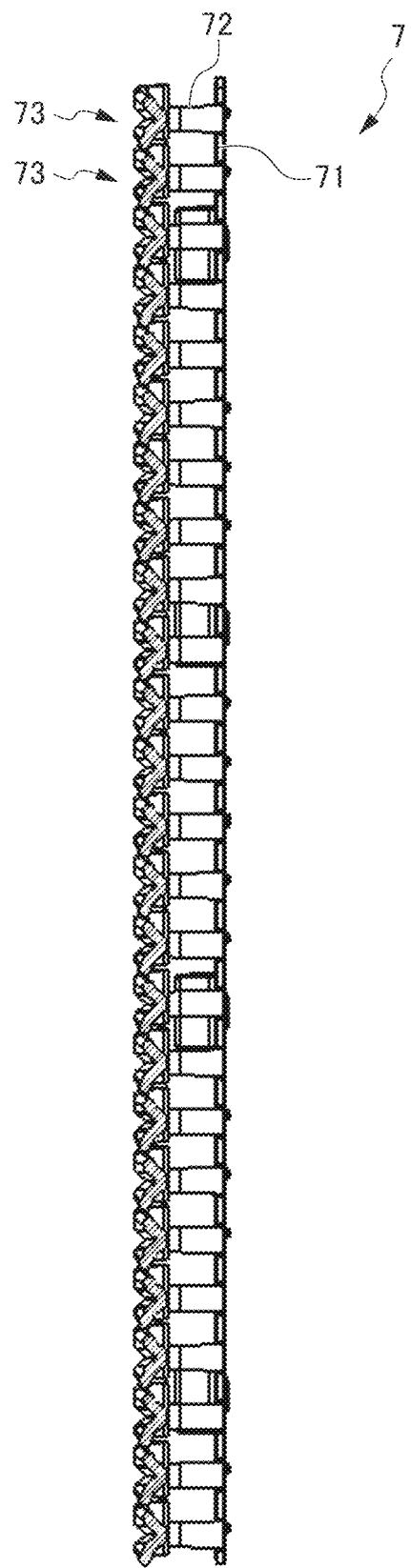
FIG. 6 is a lateral cross-sectional view of the front retainer 7 of the substrate storing container 1 according to the embodiment of the present invention.

In the following, each component will be described in detail. FIG. 4 is a perspective view of the front retainer 7 of the substrate storing container 1 according to the embodiment of the present invention. FIG. 5 is a front view of the front retainer 7 of the substrate storing container 1 according to the embodiment of the present invention. FIG. 6 is a lateral cross-sectional view of the front retainer 7 of the substrate storing container 1 according to the embodiment of the present invention. FIG. 7 is an enlarged cross-sectional view of a front retainer substrate receiving portion 73 of the substrate storing container 1 according to the embodiment of the present invention. As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are configured from the abovementioned material and are configured to be integrally molded.

The first side wall 25 faces the second side wall 26. The upper wall 23 faces the lower wall 24. A rear end of the upper wall 23, a rear end of the lower wall 24, a rear end of the first side wall 25, and a rear end of the second side wall 26 are each connected to the back wall 22. A front end of the upper wall 23, a front end of the lower wall 24, a front end of the first side wall 25, and a front end of the second side wall 26 have a positional relationship facing the back wall 22, and configure the opening circumferential portion 28 that forms the container main body opening portion 21 having a substantially rectangular shape.

The opening circumferential portion 28 is provided at one end of the container main body 2. The back wall 22 is located at the other end of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26 form the substrate storage space 27 surrounded by them. The container main body opening portion 21 formed by the opening circumferential portion 28 is in communication with the substrate storage space 27 that is surrounded by the wall portion 20 and formed inside the container main body 2. The substrate storage space 27 can store a maximum of twenty-five of the substrates W.

As illustrated in FIG. 1, latch engaging recess portions 231A, 231B, 241A, and 241B are formed at portions of the upper wall 23 and the lower wall 24 which are portions in the proximity of the opening circumferential portion 28. The latch engaging recess portions 231A, 231B, 241A, and 241B are indented outwardly of the substrate storage space 27. The latch engaging recess portions 231A, 231B, 241A, and 241B are respectively formed, one by one, in the vicinity of both left and right ends of the upper wall 23 and the lower wall 24. The total amount thereof is four.

As illustrated in FIG. 1, ribs 235 are provided so as to be integrally molded with the upper wall 23 at an outer face of the upper wall 23. The ribs 235 enhance the rigidity of the container main body 2. Furthermore, a top flange 236 is fixed at a middle portion of the upper wall 23. The top flange 236 is a member corresponding to a portion of the substrate storing container 1 from which it is hung to be suspended, when suspending the substrate storing container 1 by AMHS (Automated Material Handling System), PGV (Person Guided Vehicle), etc.

The substrate support plate-like portion 5 is an interior component that is provided at each of the first side wall 25 and the second side wall 26, and disposed within the substrate storage space 27 so as to form a pair in the left-right direction D3. More specifically, as illustrated in FIG. 2, for example, the substrate support plate-like portion 5 includes a plate portion 51 and a support wall 52 as a plate portion support portion. The plate portion 51 and the support wall 52 are configured to be integrally molded by a resin material. The plate portion 51 is supported by the support wall 52.

The plate portion 51 has a substantially plate-like arc shape. Twenty-five of the plate portions 51 are respectively provided at the first side wall 25 and the second side wall 26 in the upper-lower direction D2. The total number of the plate portions 51 is fifty. The adjacent plate portions 51 are arranged so as to be spaced apart in the upper-lower direction D2 at an interval of 10 mm to 12 mm in a parallel positional relationship. It should be noted that a plate-like member in parallel with the plate portion 51 is further arranged above the plate portion 51 that is located at the top. The plate-like member (not illustrated) serves as a guide upon inserting for the substrate W that is located at the top to be inserted into the substrate storage space 27.

Furthermore, the twenty-five plate portions 51 provided at the first side wall 25 and the twenty-five plate portions 51 provided at the second side wall 26 have a positional relationship opposite each other in the left-right direction D3. Furthermore, the fifty plate portions 51 and the plate-like member (not illustrated), which is in parallel with the plate portions 51 and serves as a guide, have a positional relationship parallel to the inner face of the lower wall 24. As illustrated in FIG. 2, etc., protruding portions 511 and 512 are provided at an upper face of the plate portion 51. The substrate W supported by the plate portion 51 is only in contact with projecting ends of the protruding portions 511 and 512, and does not contact with the face of the plate portion 51.

The support wall 52 has a plate-like shape extending in the upper-lower direction D2 and a substantially forward-backward direction D1. The support wall 52 has a predetermined length in a longitudinal direction of the plate portion 51, and is connected to a side end edge of the plate portion 51. The plate-like support wall 52 is curved toward the substrate storage space 27 along an outer side end edge of the plate portion 51.

In other words, the twenty-five plate portions 51 provided at the first side wall 25 are connected to the support wall 52 provided close to the first side wall 25. Similarly, the twenty-five plate portions 51 provided at the second side wall 26 are connected to the support wall 52 provided close to the second side wall 26. The support wall 52 is fixed to each of the first side wall 25 and the second side wall 26.

With the substrate support plate-like portion 5 of such a configuration, it is possible to support the edge portions of the plurality of substrates W in a state in which the adjacent substrates W among the plurality of substrates W are arranged to be spaced apart at a predetermined interval in a parallel positional relationship.

As illustrated in FIG. 2, the back side substrate support portion 6 includes a back side end edge support portion 60. The back side end edge support portion 60 is configured to be integrally molded with the plate portion 51 and the support wall 52 at a rear end portion of the plate portion 51 of the substrate support plate-like portion 5. Therefore, the substrate support plate-like portion 5, as the side substrate support portion, and the back side substrate support portion 6 constitute one combined interior component that is fixed to the container main body 2 in the interior of the container main body 2.

Specifically, the twenty-five back side end edge support portions 60 are provided so as to correspond to each of the substrates W that can be stored in the substrate storage space 27. The back side end edge support portion 60 arranged at the first side wall 25 and the second side wall 26 has a positional relationship forming a pair with the front retainer 7 in the forward-backward direction D1 as described later.

The back side end edge support portion 60 includes a lower side inclined face 611 and an upper side inclined face 612, which forms a substantially V-shaped groove. While the container main body opening portion 21 is closed by the lid body 3, the substrate W slides on the lower side inclined face 611 to thereby be elevated, and when the edge of the substrate W abuts the upper side inclined face 612, the edge of the substrate W is supported by the back side end edge support portion 60.

As illustrated in FIG. 1, etc., the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. A ring-like sealing member 4 is attached to a face which is an inner face (a face on the back side of the lid body 3 illustrated in FIG. 1) of the lid body 3 and faces a face of a step portion (a sealing face 281) formed at a location of the opening circumferential portion 28 in the backward direction D12, when the lid body 3 closes the container main body opening portion 21. The sealing member 4 is made from various types of thermoplastic elastomers which are polyester based, polyolefin based or the like and elastically deformable, fluorine containing rubber, silicon rubber, etc. The sealing member 4 is arranged so as to go around the circumferential edge portion of the lid body 3.

When the lid body 3 is attached to the opening circumferential portion 28, the sealing member 4 is caught by the sealing face 281 and the inner face of the lid body 3 to be elastically deformed, whereby the lid body 3 closes the container main body opening portion 21 in a sealed state. When the lid body 3 is removed from the opening circumferential portion 28, it is possible to load or unload the substrates W relative to the substrate storage space 27 in the container main body 2.

A latching mechanism is provided at the lid body 3. The latching mechanism is provided in the vicinity of both left and right end portions of the lid body 3. As illustrated in FIG. 1, the latching mechanism includes two upper side latch portions 32A which can project from the upper side of the lid body 3 in the upper direction D21, and two lower side latch portions 32B that can project from the lower side of the lid body 3 in the lower direction D22. The two upper side latch portions 32A are arranged in the vicinity of both left and right ends of the upper side of the lid body 3, and the two lower side latch portions 32B are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portions 32A and the lower side latch portions 32B to respectively project from the upper side and the lower side of the lid body 3, as well as possible to establish a state not projecting from the upper side and the lower side of the lid body 3. By the upper side latch portions 32A projecting from the upper side of the lid body 3 in the upper direction D21 to engage with the latch engaging recess portions 231A and 231B of the container main body 2 and the lower side latch portions 32B projecting from the lower side of the lid body 3 in the lower direction D22 to engage with the latch engaging recess portions 241A and 241B of the container main body 2, the lid body 3 is fixed to the opening circumferential portion 28 of the container main body 2.

As illustrated in FIG. 3, on the inner side of the lid body 3, a recessed portion 34 that is indented outwardly of the substrate storage space 27 is formed. The front retainer 7 is fixedly provided at a portion of the lid body 3 inside the recessed portion 34.

The front retainer 7 includes front retainer substrate receiving portions 73 as lid body side substrate receiving portions. The front retainer substrate receiving portions 73 are arranged so as to form pairs, each having two front retainer substrate receiving portions 73 that are spaced apart at a predetermined interval in the left-right direction D3. The front retainer substrate receiving portions 73 that are arranged so as to form the pairs, each having two front retainer substrate receiving portions 73, are provided in a state in which twenty-five pieces of the pairs are arranged in parallel in the upper-lower direction D2, and each of them is supported by an elastically deformable leg portion 72 as a lid body side leg portion. At the end of the leg portion 72, a vertical frame body 71 that extends in parallel along the upper-lower direction D2 is provided to be integrally formed with the leg portion 72. When the substrates W are stored in the substrate storage space 27 and the space is closed by the lid body 3, the front retainer substrate receiving portion 73 sandwiches and supports the substrates W in a state in which the end edge of the edge of each of the substrates W is being biased toward the center of the substrate storage space 27 owing to the elastic force of the leg portion 72.

Specifically, as illustrated in FIG. 7, the front retainer substrate receiving portion 73 includes a lower side inclined face 731 and an upper side inclined face 732.

The lower side inclined face 731 abuts an end edge of the back side of the substrate W, while the container main body opening portion 21 is closed by the lid body 3. The upper side inclined face 732 abuts the end edge of the front face of the substrate W. Specifically, the lower side inclined face 731 is configured by an inclined face that extends in an inclined manner so as to be spaced apart from the center of the substrate storage space 27 in the forward-backward direction D1 as advancing in the upper direction D21. The upper side inclined face 732 is configured by an inclined face that extends in an inclined manner so as to approach the center of the substrate storage space 27 in the forward-backward direction D1 as advancing in the upper direction D21. The lower side inclined face 731 and the upper side inclined face 732 form a V-shaped groove 703 that is dented so as to be spaced apart from the center of the substrate storage space 27 and extends in the left-right direction D3.

Furthermore, the front retainer substrate receiving portion 73 includes a lower side substrate guiding inclined face 733 and an upper side substrate guiding inclined face 734. The lower side substrate guiding inclined face 733 is connected to a lower end portion of the lower side inclined face 731, and extends in an inclined manner substantially in the lower direction. The angle formed by the lower side substrate guiding inclined face 733 with the upper-lower direction D2 is smaller than the angle formed by the lower side inclined face 731 with the upper-lower direction D2. In other words, as illustrated in FIG. 7, the lower side substrate guiding inclined face 733 is inclined in such a manner that the V-shaped groove 703 is made larger as going away from the apex of the V-shaped groove 703.

The upper side substrate guiding inclined face 734 is connected to an upper end portion of the upper side inclined face 732, and extends in an inclined manner substantially in the upper direction. The angle formed by the upper side substrate guiding inclined face 734 with the upper-lower direction D2 is smaller than the angle formed by the upper side inclined face 732 with the upper-lower direction D2. In other words, as illustrated in FIG. 7, the upper side substrate guiding inclined face 734 is inclined in such a manner that the V-shaped groove 703 is made larger as going away from the apex of the V-shaped groove 703.

As illustrated in FIG. 5, etc., the front retainer substrate receiving portion 73 has a parallelogram shape as viewed in a direction from one end to the other end of the container main body 2, i.e., viewed from the back face. In other words, the front retainer substrate receiving portion 73 includes a pair of short sides and a pair of long sides. In the view from the back face as illustrated in FIG. 5, the pair of short sides has a positional relationship that is in parallel with the upper-lower direction D2. Furthermore, in the view from the back face as illustrated in FIG. 5, the pair of long sides has a positional relationship that has a predetermined angle with respect to the left-right direction D3. In the left-right direction D3 in which the V-shaped groove 703 extends while the container main body opening portion 21 is closed by the lid body 3, the length of the lower side substrate guiding inclined face 733 in the upper-lower direction D2 becomes longer toward the lower direction D22 as approaching the center of the container main body opening portion 21, i.e., as approaching the center of the front retainer 7 in FIG. 5.

Furthermore, as described above, since the front retainer substrate receiving portion 73 has a parallelogram shape, the upper side substrate guiding inclined face 734 extends in the upper direction D21 as going away from the center of the front retainer 7; however, a left end portion of the upper side substrate guiding inclined face 734 of the front retainer substrate receiving portion 73 on the left side (the right side in FIG. 5) has a shape in which a chamfer 735 is formed so that a width in the upper-lower direction D2 becomes shorter as going further in the left direction D31 from a predetermined location. Similarly, a right end portion of the upper side substrate guiding inclined face 734 of the front retainer substrate receiving portion 73 on the right side has a shape in which the chamfer 735 is formed so that a width in the upper-lower direction D2 becomes shorter as going further in the right direction D32 from a predetermined location.

Next, operations upon storing the substrates W in the substrate storage space 27 in the above-described substrate storing container 1 and closing the container main body opening portion 21 by the lid body 3 will be described. FIG. 8 is a schematic diagram illustrating a state in which the substrate W is inserted into the V-shaped groove 703 of the front retainer substrate receiving portion 73 of the substrate storing container 1 according to the embodiment of the present invention. First, as illustrated in FIG. 1, the container main body 2 is disposed so that the forward-backward direction D1 and the left-right direction D3 have a positional relationship of being in parallel with each other with respect to a horizontal plane. Next, a plurality of substrates W are each placed on the protruding portions 511 and 512 of the plate portion 51 of the substrate support plate-like portion 5.

Next, the lid body 3 is made to approach the container main body opening portion 21 and abut the front retainer substrate receiving portion 73 of the front retainer 7. Thereafter, as illustrated in FIG. 8, when the lid body 3 is made to further approach the container main body opening portion 21, since the end edge of the back face of the end of the substrate W faces the lower side substrate guiding inclined face 733 which is formed longer in the upper-lower direction D2, the end edge thereof abuts the lower side substrate guiding inclined face 733, thereby being slid and guided in the direction indicated by the arrow in FIG. 8. Thereafter, when reaching the lower side inclined face 731, the end edge of the back face of the edge portion of the substrate W abuts the lower side inclined face 731, and slides on the lower side inclined face 731 to thereby be elevated. Similarly, in the back side end edge support portion 60 as well, when the substrate W reaches the lower side inclined face 611 (not illustrated), the end edge of the back face of the edge portion of the substrate W abuts the lower side inclined face 611 of the back side end edge support portion 60, and slides on the lower side inclined face 611 to thereby be elevated.

Thereafter, when the substrate W reaches the location of the apex of the V-shaped groove 703, the end edge of the back face and the end edge of the front face of the substrate W respectively abut the lower side inclined face 731 and the upper side inclined face 732 so that the edge portion of the substrate W is supported by the V-shaped groove 703. Similarly, the end edge of the back face and the end edge of the front face of the substrate W respectively abut the lower side inclined face 611 and the upper side inclined face 612 of the back side end edge support portion 60, and are supported by the back side end edge support portion 60.

With the substrate storing container 1 according to the present embodiment of the configuration described above, the following effects are obtained. As described above, the substrate storing container 1 includes: a container main body 2 including an opening circumferential portion 28 at one end thereof where a container main body opening portion 21 is formed, and including a tubular wall portion 20 having another end thereof which is closed, in which a substrate storage space 27 is formed which can store a plurality of substrates W by an inner face of the wall portion 20, and is in communication with the container main body opening portion 21; a lid body 3 that is attachable to and detachable from the container main body opening portion 21 and can close the container main body opening portion 21; a substrate support plate-like portion 5 as a side substrate support portion that is provided to form a pair in the substrate storage space 27 and, while the container main body opening portion 21 is not closed by the lid body 3, can support edge portions of the plurality of substrates W in a state in which adjacent substrates W among the plurality of substrates W are spaced apart by a predetermined interval and arranged in parallel to each other; a front retainer 7 as a lid body side substrate support portion that, while the container main body opening portion 21 is closed by the lid body 3, is disposed at a portion of the lid body 3 that faces the substrate storage space 27 and can support the edge portions of the plurality of substrates W; and a back side substrate support portion 6 that is provided to form a pair with the front retainer 7 in the substrate storage space 27 and can support the edge portions of the plurality of substrates W and, while the container main body opening portion 21 is closed by the lid body 3, cooperates with the front retainer 7 to be able to support the plurality of substrates W. The front retainer 7 includes a front retainer substrate receiving portion 73 as a lid body side substrate receiving portion that directly abuts the substrates W to support the substrates W, and a leg portion 72 as a lid body side leg portion that supports the lid body side substrate receiving portion 73. The front retainer substrate receiving portion includes: a lower side inclined face 731 that extends in an inclined manner to be spaced apart from a center of the substrate storage space 27; an upper side inclined face 732 that extends in an inclined manner from an upper end portion of the lower side inclined face 731 so as to approach the center of the substrate storage space 27; a lower side substrate guiding inclined face 733 that is connected to a lower end portion of the lower side inclined face, in which an angle a formed by the lower side substrate guiding inclined face 733 with an upper-lower direction D2 corresponding to a parallel direction in which the plurality of substrates are provided in parallel with each other is smaller than an angle b formed by the lower side inclined face 731 with the upper-lower direction D2; and an upper side substrate guiding inclined face 734 that is connected to an upper end portion of the upper side inclined face 732, in which an angle a formed by the upper side substrate guiding inclined face 734 with the upper-lower direction D2 is smaller than an angle b formed by the upper side inclined face 732 with the upper-lower direction D2. While the container main body opening portion 21 is closed by the lid body 3, the lower side inclined face 731 and the upper side inclined face 732 abut the substrate W, and the substrate W is supported in a V-shaped groove 703 that is formed by the lower side inclined face 731 and the upper side inclined face 732. In a direction in which the V-shaped groove 703 extends while the container main body opening portion 21 is closed by the lid body 3, a length of the lower side substrate guiding inclined face 733 in the upper-lower direction D2 becomes longer as approaching a center of the container main body opening portion 21.

With the configuration described above, the lower side substrate guiding inclined face 733 is made larger in the lower direction D22. With such a configuration, when the lid body 3 is closed, the end edge of the back face of the edge portion of the substrate W is likely to abut the lower side substrate guiding inclined face 733. As a result, it is possible to establish a state in which the lid body 3 easily abuts the lower side inclined face 731 via the lower side substrate guiding inclined face 733, thereby making it possible to guide to the V-shaped groove 703 reliably. This makes it possible to reduce failure in guiding of the substrate W in the front retainer 7, i.e., the occurrence of the state of substrate dislocation in which the substrate W slips into a plurality of adjacent front retainer substrate receiving portions 73. Therefore, when the lid body 3 is closed, it is unnecessary to be concerned with failure in guiding of the substrate W.

Furthermore, the front retainer substrate receiving portion 73 has a parallelogram shape as viewed from the back side which is in a direction from one end to the other end of the container main body 2 (forward direction D11). With the above configuration, it is possible to make the lower side substrate guiding inclined face 733 larger in the lower direction D22 without widening the interval between the V-shaped grooves 703 that are adjacent in the upper-lower direction D2. Therefore, it is possible to set the location of the substrate W that is supported at the V-shaped groove 703 to be at a location similar to that of the conventional configuration which does not make the substrate guiding inclined face 733 larger, while the container main body opening portion 21 is closed by the lid body 3.

The present invention is not limited to the abovementioned embodiments, and modifications thereto within the technical scope claimed in the claims are possible.

For example, the shapes of the container main body and the lid body and the number and dimensions of substrates that can be stored in the container main body are not limited to the shape of the container main body 2 and the lid body 3, and the number and dimensions of the substrates W that can be stored in the container main body 2 according to the present embodiments. In other words, the configurations of the side substrate support portion, the lid body side substrate support portion, and back side substrate support portion are not limited to the configuration of the substrate support plate-like portion 5, the front retainer 7, and the back side substrate support portion 6. Furthermore, the substrate W in the present embodiment is a silicon wafer having a diameter of 300 mm; however, this value is not limitative. For example, the configuration of the lid body side substrate receiving portion is not limited to the configuration of the front retainer substrate receiving portion 73. Therefore, the left end portion of the upper side substrate guiding inclined face 734 of the front retainer substrate receiving portion 73 on the left side (the right side in FIG. 5), and the right end portion of the upper side substrate guiding inclined face 734 of the front retainer substrate receiving portion 73 on the right side (the left side in FIG. 5) each have a shape in which a chamfer 735 is formed. However, the present invention may not necessarily have such a shape in which a chamfer is formed. Furthermore, the back side substrate support portion is configured by the back side substrate support portion 6 in the present embodiment. However, the present invention is not limited to this configuration. For example, the back side substrate support portion may be configured by a rear retainer which is configured by being integrally formed with the container main body.

EXPLANATION OF REFERENCE NUMERALS 1 substrate storing container
2 container main body
3 lid body 5 substrate support plate-like portion (side substrate support portion)
6 back side substrate support portion
7 front retainer (lid body side substrate support portion)
20 wall portion
21 container main body opening portion
27 substrate storage space
28 opening circumferential portion
72 leg portion (lid body side leg portion)
73 front retainer substrate receiving portion (lid body side substrate receiving portion)
703 V-shaped groove
731 lower side inclined face
732 upper side inclined face
733 lower side substrate guiding inclined face
734 upper side substrate guiding inclined face
W substrate

The invention claimed is:

1. A substrate storing container comprising:
a container main body including an opening circumferential portion at one end thereof where a container main body opening portion is formed, and including a tubular wall portion having another end thereof which is closed, wherein a substrate storage space is formed which can store a plurality of substrates by an inner face of the wall portion, and is in communication with the container main body opening portion;
a lid body that is attachable to and detachable from the container main body opening portion and can close the container main body opening portion;
a pair of side substrate support portions, wherein one side substrate support portion is disposed on either side of the substrate storage space and, while the container main body opening portion is not closed by the lid body, can support edge portions of the plurality of substrates in a state in which adjacent substrates among the plurality of substrates are spaced apart by a predetermined interval and arranged in parallel to each other;
a lid body side substrate support portion that, while the container main body opening portion is closed by the lid body, is disposed at a portion of the lid body that faces the substrate storage space and can support the edge portions of the plurality of substrates; and
a back side substrate support portion that is provided to form a pair with the lid body side substrate support portion in the substrate storage space and can support the edge portions of the plurality of substrates and, while the container main body opening portion is closed by the lid body, cooperates with the lid body side substrate support portion to be able to support the plurality of substrates,
wherein the lid body side substrate support portion includes a lid body side substrate receiving portion that directly abuts the substrates to support the substrates, and a lid body side leg portion that supports the lid body side substrate receiving portion,
wherein the lid body side substrate receiving portion includes:
a lower side inclined face that extends in an inclined manner to be spaced apart from a center of the substrate storage space;
an upper side inclined face that extends in an inclined manner from an upper end portion of the lower side inclined face so as to approach the center of the substrate storage space;
a lower side substrate guiding inclined face that is connected to a lower end portion of the lower side inclined face, wherein an angle formed by the lower side substrate guiding inclined face with a vertical direction corresponding to a parallel direction in which the plurality of substrates are provided in parallel with each other is smaller than an angle formed by the lower side inclined face with the upper-lower direction; and
an upper side substrate guiding inclined face that is connected to an upper end portion of the upper side inclined face, wherein an angle formed by the upper side substrate guiding inclined face with the upper-lower direction is smaller than an angle formed by the upper side inclined face with the upper-lower direction,
wherein, while the container main body opening portion is closed by the lid body, the lower side inclined face and the upper side inclined face abut the substrate, and the substrate is supported in a groove that is formed by the lower side inclined face and the upper side inclined face,
wherein, in a direction in which the groove extends while the container main body opening portion is closed by the lid body, a length of the lower side substrate guiding inclined face in the upper-lower direction becomes longer as approaching a center of the container main body opening portion, and
wherein the lid body side substrate receiving portion has a parallelogram shape as viewed in a direction from one end to the other end of the container main body.

* * * * *